(12) United States Patent
Kouznetsov

(10) Patent No.: US 6,531,366 B1
(45) Date of Patent: Mar. 11, 2003

(54) METHOD AND STRUCTURE FOR HIGH-VOLTAGE DEVICE WITH SELF-ALIGNED GRADED JUNCTIONS

(75) Inventor: Igor Kouznetsov, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/904,328

(22) Filed: Jul. 12, 2001

(51) Int. Cl.[7] .............................................. H01L 21/336
(52) U.S. Cl. ........................ 438/303; 438/231; 438/306
(58) Field of Search ................................. 438/231, 301, 438/303, 305, 306

(56) References Cited

U.S. PATENT DOCUMENTS 5,330,925 A * 7/1994 Lee et al. ................... 438/305
5,759,901 A * 6/1998 Loh et al. ................... 438/305
5,793,090 A * 8/1998 Gardner et al. ............. 257/408
5,830,790 A * 11/1998 Kim et al. .................. 438/227
6,172,397 B1 * 1/2001 Oonakado et al. .......... 257/321

* cited by examiner

Primary Examiner—T. N. Quach
(74) Attorney, Agent, or Firm—Bradley T Sako

(57) ABSTRACT

A method of fabricating a semiconductor device (300) is disclosed. A low energy ion implantation (318) may form low voltage source and drain regions in a low voltage region (402-3) of a substrate. A low energy implant may also form a portion of source and drain regions in a high voltage region (402-2). A high energy ion implantation (322) may complete the formation of high voltage transistors in a high voltage region (402-2). A high voltage gate structure (418-2) may be exposed during a high energy ion implantation and mask a channel region.

20 Claims, 6 Drawing Sheets

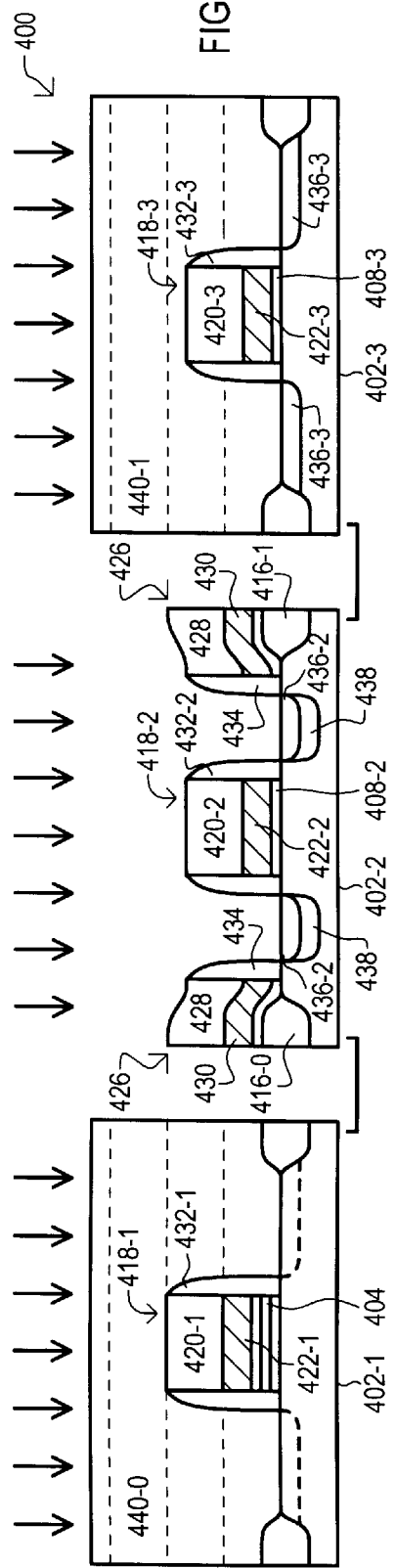

METHOD AND STRUCTURE FOR HIGH-VOLTAGE DEVICE WITH SELF-ALIGNED GRADED JUNCTIONS

TECHNICAL FIELD

The present invention relates generally to integrated circuits, and more particularly to integrated circuits that includes both low voltage and high voltage devices.

BACKGROUND OF THE INVENTION

While many types of integrated circuits may be designed to operate with a single internal voltage, it is often desirable to provide a circuit that is capable of handling two or more different voltage levels. One such application can be integrated circuits that include circuit devices (e.g., transistors as well as passive circuit elements) that operate in the range of a typical power supply voltage, and circuit devices that operate at voltage magnitudes that are substantially greater than a typical power supply voltage. The former circuit devices are often referred to as "low voltage devices," while the latter are often referred to as "high voltage devices."

While the inclusion of high and low voltage devices may have various applications, one particular useful application can be within integrated circuits that include programmable and/or erasable nonvolatile storage elements. In such devices, a program and/or erase operation may include the application of a relatively high potential to one or more nonvolatile storage elements.

Nonvolatile storage elements may take a variety of forms, including electrically erasable programmable read only memory (EEPROM) cells, as but one example. Such memory cells may be arranged to primarily provide a storage function, or may be part of a memory that is "embedded" into an integrated circuit that can provide a more complicated function. One type of nonvolatile memory cell is a silicon-oxide-nitride-oxide-silicon (SONOS) type transistor. SONOS type transistors can have advantageous programming and/or erase properties, over other conventional approaches. For example, some SONOS type technologies may include lower programming and/or erase voltages than other nonvolatile technologies.

The various different devices described above (low voltage, high voltage and SONOS) can have particular manufacturing requirements. Accordingly, conventional approaches to manufacturing such devices have included specialized steps that can be difficult to implement. In particular, for high voltage insulated gate field effect transistors (IGFETs), it may be desirable to provide multiple source/drain implant steps, while at the same time maintaining a predetermined channel length.

While high voltage IGFET type transistors may be n-channel or p-channel type transistors, the formation of high voltage p-channel transistors can be more difficult due to the lower breakdown voltages of such devices.

To better understand transistor formation steps and various aspects of the disclosed embodiments, two conventional high voltage transistor fabrication methods will now be described.

Referring now to FIGS. 5A and 5B, a first conventional method for forming a high voltage IGFET is shown in a side cross sectional view. As shown in FIG. 5A, a transistor structure 500 may be formed on a substrate 502. A transistor structure 500 may include a conductive gate 504 formed on a gate insulator 506 with sidewall insulators 508-0 an 508-1 (also referred to as spacers) and top insulator 510. Low voltage source/drain regions 512-0 and 512-1 may be formed by a first ion implantation step that can use a conductive gate 504/top insulator 510 and sidewall insulators (508-0 an 508-1) as implant masks. The energy of implanted ions is typically low enough to prevent ions from penetrating into a transistor channel 514.

To provide more favorable high voltage characteristics, source/drain regions (512-0 and 512-1) may be subjected to a second "high" energy ion implantation step. A high energy implant step may implant ions with greater energy than ion implantation steps that form low voltage devices. However, such higher energy ions can have greater penetrating power, thus a conventional top insulator 510 and conductive gate 504 thickness may not be great enough to prevent high energy ions from being implanted into a channel region 514. To retain channel doping integrity, an additional implant mask may be formed over a transistor structure, as shown in FIG. 5B.

FIG. 5B shows a high energy implant mask 516 formed over a transistor structure 500. However, FIG. 5B shows possible drawbacks to such an approach. In particular, a high energy implant mask 516 may be misaligned with respect to an underlying conductive gate 504 and top insulator 510. A resulting misalignment of high energy source/drain regions (518-0 and 518-1) with respect to low energy source/drain regions (512-0 and 512-1) can reduce the breakdown voltage of a high voltage device. Along these same lines, such a misalignment can effectively reduce the channel length of a transistor as a high energy source/drain region 518-0 can extend past a low energy source/drain region 512-0.

Thus, while the approach of FIGS. 5A and 5B may provide for longer transistor channel lengths, misalignment may occur.

A second conventional approach for forming a high voltage IGFET 600 is shown in a series of side cross sectional views in FIGS. 6A and 6B. FIG. 6A shows a substrate 602 on which may be formed a gate insulator layer 604, a conductive gate layer 606, and a top insulating layer 608. A gate etch mask 610, of photoresist or the like, may be formed over a top insulating layer 608. A gate etch mask 610 may have a desired gate shape.

As shown in FIG. 6B, layers (604–608) formed over a substrate may be etched with a gate etch mask 610. A resulting gate structure 600 may include a gate insulator 604, a conductive gate 606, and a top insulator 608. Following the formation of a gate structure 600, low energy source/drain regions 612 may be formed with a first implantation step. Further, high energy source/drain regions 614 may also be formed with a second implantation step having a higher energy than a first implantation step. A combination of a gate etch mask 610, top insulator 608, and conductive gate 606 can serve to prevent high energy implant ions from entering a channel region 616. Thus, low and high energy source/drain regions (612 and 614) can be self-aligned with a gate etch mask 610.

One drawback to an approach like that of FIGS. 6A and 6B can be limitations in transistor formation. More particularly, source/drain regions (612 and 614) can be aligned with edges of the gate. Thus, larger spacing between source/drain regions, such as that achieved in the example of FIGS. 5A and 5B, may not be possible with an approach such as that show in FIGS. 6A and 6B.

Another concern associated with high voltage devices can be current leakage. More particularly, if an ion implantation step results in the implantation of ions on the edge of an isolation region, it may be easier for a leakage path to develop through such isolation regions. This may be an important issue for devices that are formed with higher energy implant step due to the deeper penetration of high energy ion.

In light of the above, it would be desirable to arrive at some way of forming a high voltage device that may be easily integrated into an existing IGFET and/or SONOS manufacturing process. It would also be desirable to arrive at some way of forming a high voltage device that does not suffer from the drawbacks of the conventional approaches described above.

SUMMARY OF THE INVENTION

According to one embodiment of the present invention, a method of forming a semiconductor device may include implanting first ions into a low voltage (LV) region and a high voltage (HV) region of a substrate. A HV region may include a HV gate structure that includes insulating sidewalls, a top insulator, and a HV gate. Second ions may be implanted into a HV region to form high voltage source/drain regions. A top insulator of a HV gate structure may be exposed when second ions are implanted. A top insulator and insulating sidewalls may be implant masks for second ions, in a self-aligned high energy source/drain implant step.

According to one aspect of the embodiments, first and second ions may include boron and high voltage source/drains regions may be part of a p-channel high voltage transistor.

According to another aspect of the embodiments, first ions may be implanted with a low energy implant while second ions may be implanted with a high energy implant. A low energy may be less than 30 keV, while a high energy may be greater than 45 keV. Such differences in implant energy may form graded junctions having advantageously higher junction breakdown voltages.

According to another aspect of the embodiments, first ions may form low voltage source/drains in a LV region of a substrate. A LV region may include a LV gate structure that includes insulating sidewalls, a top insulator, and a LV gate. Thus, first ions may form LV source/drain regions, and at the same time form portions of graded HV source/drain regions.

According to another aspect of the embodiments, a third region of a substrate may include a nonvolatile gate structure. A nonvolatile gate structure may include insulating sidewalls, a top insulator, and a nonvolatile gate formed over a charge storing structure. A third region may be masked from first and second ions. Thus, an HV device that includes graded source and drain regions may be formed with nonvolatile devices.

According to another aspect of the embodiments, a nonvolatile gate structure charge storing structure may include a silicon nitride containing layer sandwiched between silicon dioxide containing layers. Such a charge storing structure may form SONOS type devices.

According to another aspect of the embodiments, a HV region may include implant mask structures. Implant mask structures may be formed with the same steps as a HV gate structure, but may be formed over an interface between an active area (e.g., an area that may contain a transistor source/channel/drain) and an isolation structure. Implant mask structures may prevent high energy ions from being implanted into such interfaces. Preventing high energy ions from being implanted into such regions may prevent current leakage paths from developing.

According to another aspect of the embodiments, a top insulator in a HV gate structure may be relatively thick, when compared with conventional approaches, to a gate length. For example, a gate length may be less than 0.5 microns, while a top insulator may be thicker than 2,200 angstroms.

BRIEF DESCRIPTION OF THE DRAWINGS

FIGS. 4A to 4G are side cross sectional views of a semiconductor device according to another embodiment.

DETAILED DESCRIPTION OF THE EMBODIMENTS

Various embodiments of the present invention will now be described with reference to a number of diagrams. The embodiments include methods of forming a high voltage device and corresponding structures. In particular embodiments, a high voltage device may be formed in the same substrate as a low voltage device and a nonvolatile storage device.

Figure 1:
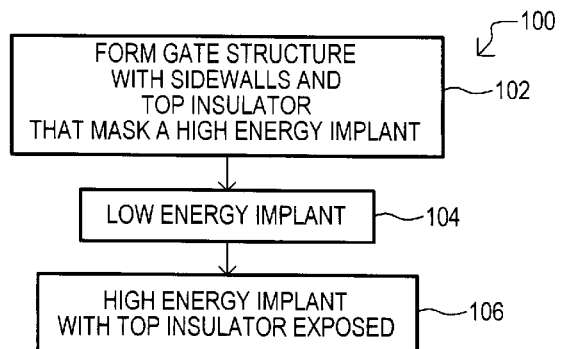
FIG. 1 is a flow diagram of a method according to one embodiment.

A first embodiment will now be described with reference to FIGS. 1 and 2A to 2C. FIG. 1 is a flow diagram illustrating a method of forming a high voltage device according to an embodiment. The method is designated by the general reference character 100 and may include forming a gate structure with sidewalls and a top insulator (step 102). Such a sidewall and top insulator may mask a channel during a high energy ion implant. A semiconductor device following a step 102 is shown in FIG. 2A.

Figure 2A:
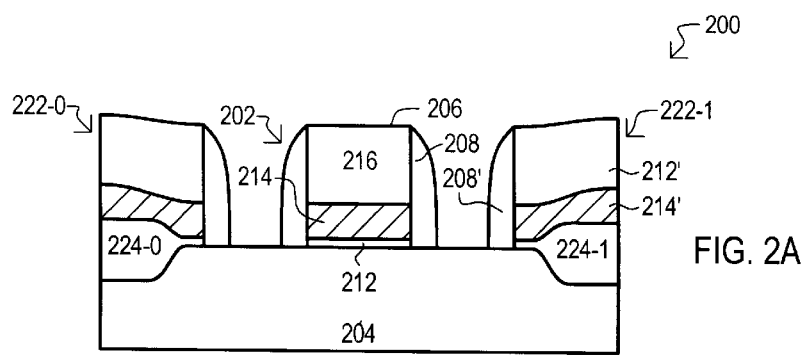
FIGS. 2A to 2C are side cross sectional views of a semiconductor device according to an embodiment.

FIG. 2A is a side cross sectional view of a semiconductor device 200 that includes a gate structure 202 formed on a semiconductor substrate 204. A gate structure 202 may include a gate "stack" 206 with insulating sidewalls 208. A gate stack 206 may include a gate insulator 212, a conductive gate 214, and a top insulator 216.

Figure 5A:
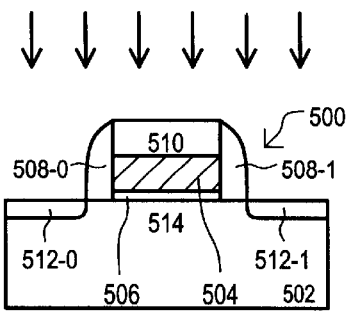
FIGS. 5A and 5B are side cross sectional views of a conventional method of forming a high voltage semiconductor device.
Figure 5B:
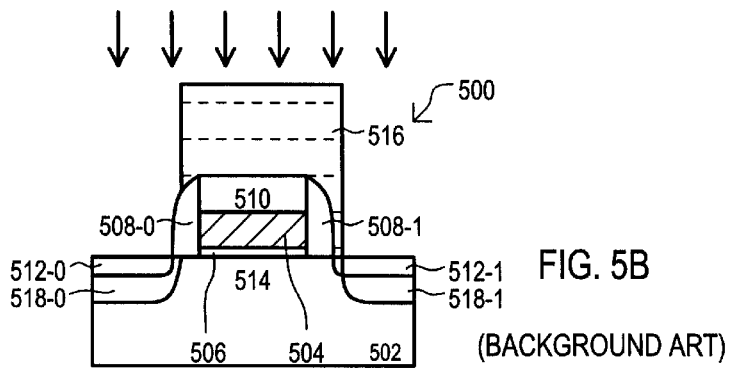
Figure 6A:
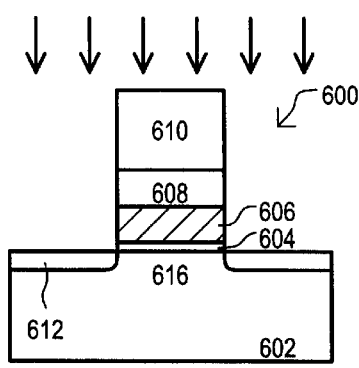
FIGS. 6A and 6B are side cross sectional views of another conventional method of forming a high voltage semiconductor device.
Figure 6B:
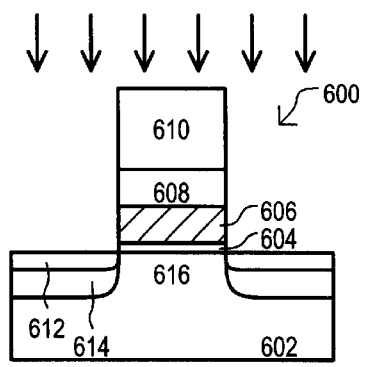

Unlike conventional approaches that include a high voltage implant mask formed from photoresist (such as that shown in FIG. 5B), in the arrangement of FIG. 2A, a gate stack 206 and insulating sidewalls 208 can function as masks for a high voltage ion implantation step. In one particular arrangement, a top insulator 216 may have a greater thickness than conventional approaches, and thus may stop high energy ions from being implanted into a substrate. High energy implant ions will be described in more detail below.

Still further, in a structure such as that shown in FIG. 2A, insulating sidewalls 208 may also mask a high energy implant.

Referring back to FIG. 1, an embodiment 100 may further include a low energy ion implant step 104. A low energy ion implantation step 104 may accelerate ions with a lower energy than a high energy implant step. In one particular approach, a low voltage implant may form low voltage source and/or drain (source/drain) regions for transistor devices operating at, or about a first power supply voltage. Low voltage source/drain regions may include lightly doped source/drain (LDD) extension, which can be implanted before insulating sidewalls 208 are formed. As but a few examples, low voltage transistor devices may perform typical logic functions in an integrated circuit. Digital output data may be provided at a low voltage level and/or a majority of an integrated circuit may be supplied with a lower voltage as a power supply. A semiconductor device following a step 104 is shown in FIG. 2B.

Figure 2B:
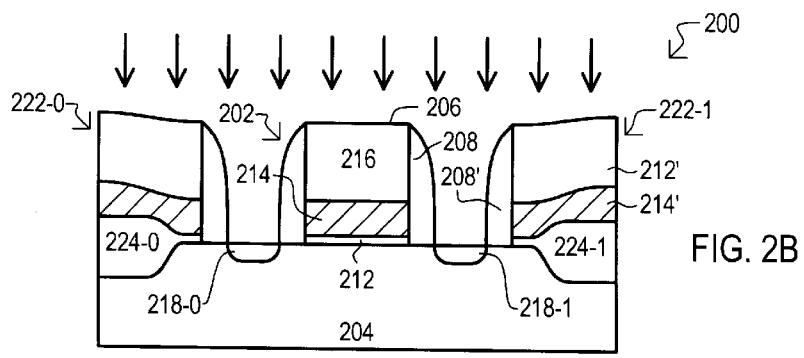

FIG. 2B represents the implantation of low energy ions as a number of vertical arrows. Of course, the particular direction of the arrows should not be construed as limiting the invention thereto. Alternate approaches might include a tilt implant, or the like. Low energy implanted ions can form low voltage source/drain regions 218-0 and 218-1 in a substrate 204.

In one very particular example, low energy ions may be implanted at a dose in the range of $10^{13}$ to $10^{17}$ ions/cm$^2$, preferably $10^{14}$ to $10^{16}$ ions/cm$^2$, even more preferably about $1.6 \times 10^{15}$. Implant energies may be in the range of 40–65 keV, preferably about 43–57 keV, even more preferably about 50 keV. Implanted species may include boron as part of $BF_2^{49}$.

A method 100 may further include a high energy ion implant step with a top insulator exposed (step 106). A high energy ion implantation step 104 may accelerate ions with a greater energy than a low energy implant step. In one particular approach, a high energy implant may form all, or a portion of, high voltage source and/or drain (source/drain) regions. Such high voltage source/drain regions may form portions of transistor devices operating at, or about a voltage higher than the normal power supply voltage of a device. As but a few examples, high voltage transistor devices may receive a high voltage that is greater in magnitude than a power supply voltage of a semiconductor device. Such a high voltage may be provided from an external source, or can be generated on an integrated circuit device (i.e., "on-chip"). In one particular embodiment, a high voltage may be a programming and/or erase voltage for nonvolatile semiconductor device, more particularly a silicon-oxide-nitrideoxide-silicon (SONOS)-type device. A semiconductor device following a step 106 is shown in FIG. 2C.

Figure 2C:
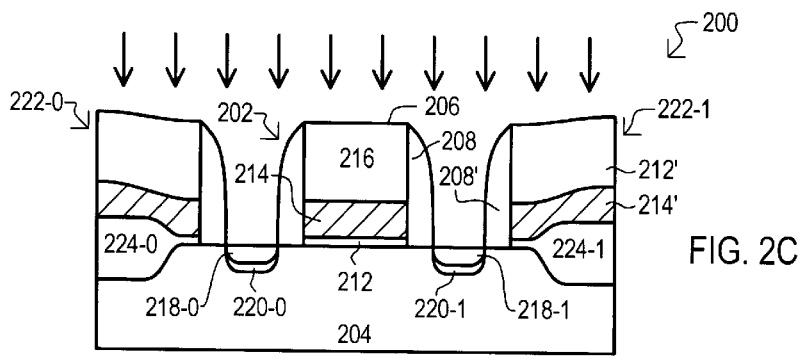

FIG. 2C shows the implantation of high energy ions with a number of vertical arrows. As in the case of the FIG. 2B, the particular direction of the arrows should not be construed as limiting to the invention. High energy implanted ions can form high voltage source/drain regions 220-0 and 220-1 in a substrate 204. Due to the greater energy of the implanted ions, high voltage source/drain regions (220-0 and 220-1) can be deeper than low voltage source/drain regions (220-0 and 220-1). A mixture of high and low voltage source/drain regions (218-0/1 and 220-0/1) may result in a source/drains having a "graded" junction, and hence the ability to withstand greater breakdown voltages.

In one very particular example, high energy ions may be implanted at a dose in the range of $10^{10}$ to $10^{14}$ ions/cm$^2$, preferably $10^{12}$ to $10^{14}$ ions/cm$^2$, even more preferably about $5.0 \times 10^{13}$. Implant energies may be in the range of 30–70 keV, preferably about 40–60 keV, even more preferably about 50 keV. Implanted ions may include the boron species $B_{11}$.

It is noted that the above-described embodiment illustrates a high voltage p-channel insulated gate field transistors (IGFET). As previously noted, p-channel transistors can have lower breakdown voltages than n-channel IGFETs. A two step implant step may provide for higher breakdown voltages by forming source and drain regions with graded impurity distribution profiles. Still further, by not including an implant mask of resist, a manufacturing process may be simplified and/or misalignment errors may be reduced or avoided.

Referring once again to FIGS. 2A to 2C, a method according to the present invention may protect substrate regions that could conventionally contribute to leakage. In particular, conventional high energy implant steps may implant ions into an isolation region and/or isolation region interface, which can create leakage paths.

According to one embodiment, a semiconductor device may include interface implant masks 222-0 and 222-1 formed over the interface of a substrate 204 and isolation regions 224-0 and 224-1. Implant masks (222-0 and 222-1) may have the same essential structure as a gate structure 202, including a conductive gate 214', a top insulator 212' and sidewalls 208'. In one particular approach, implant masks (222-0 and 222-1) may be formed at the same time a gate structure 202 is formed.

While a high voltage device and method for making such a device may have various applications, one application can be the integration of such devices in the manufacturing of a semiconductor device that includes nonvolatile memory cells. Such an embodiment will now be described with reference to FIGS. 3 and 4A to 4G.

Figure 3:
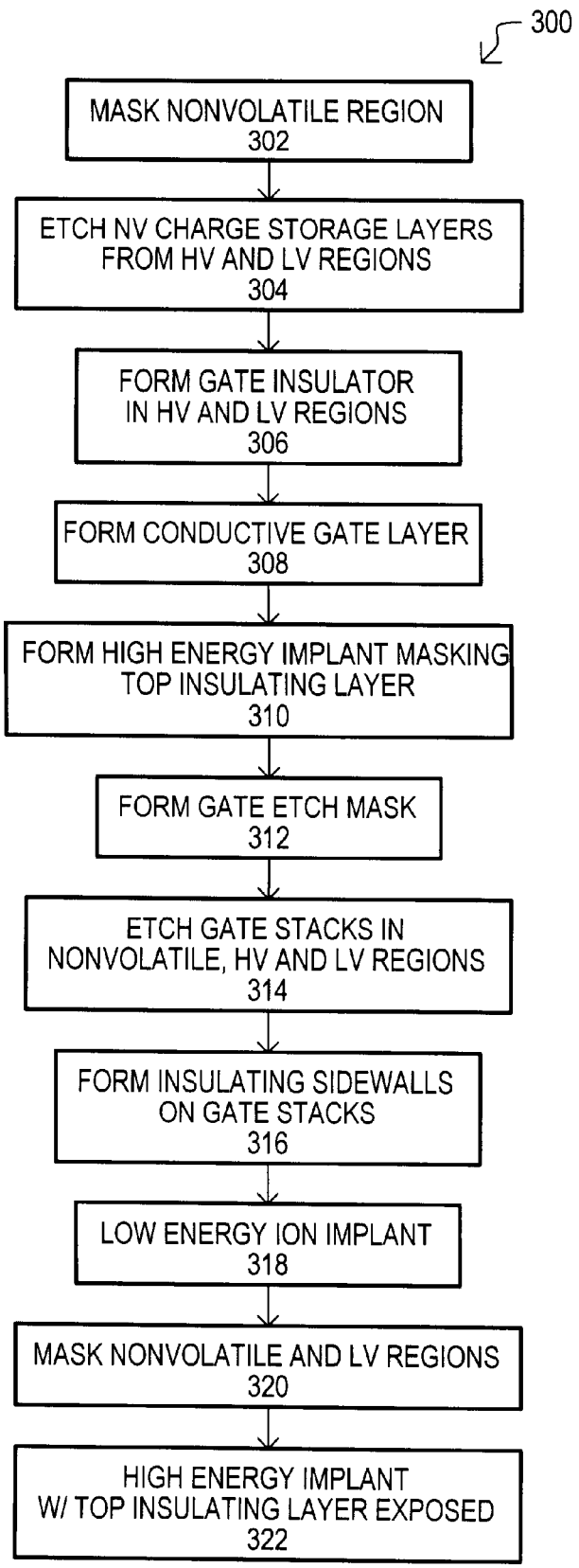
FIG. 3 is a flow diagram of a method according to another embodiment.
Figure 4A:
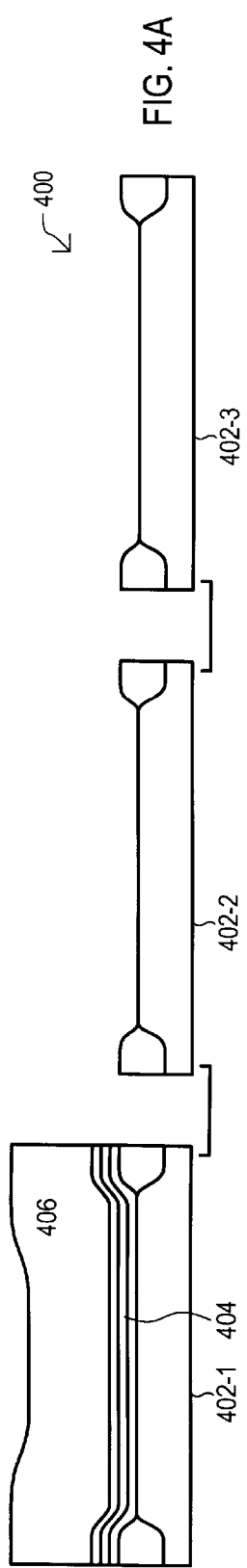

Referring now to FIG. 3, a method of forming a semiconductor device 300 may include masking a nonvolatile region of a semiconductor substrate (step 302). A nonvolatile dielectric layer may then be etched from high voltage regions and low voltage regions of a semiconductor substrate (step 304). A semiconductor device 400 following steps 300 and 302 is shown in FIG. 4A. A semiconductor device 400 may include a substrate having a nonvolatile region 402-1, a high voltage (HV) region 402-2, and a low voltage (LV) region 402-3. A nonvolatile region 402-1 may be a region in which one or more nonvolatile devices can be formed. As but a two examples, nonvolatile region may contain an array of nonvolatile memory cells, or just one nonvolatile memory cell that may be integrated into a larger circuit structure, such as a nonvolatile latch, or the like.

A HV region 402-2 may be a region in which one or more high voltage devices are formed. As noted above, high voltage devices may receive a voltage that is higher than a power supply voltage. It can be advantageous to integrate high voltage devices with nonvolatile devices, as high voltage devices may apply and/or generate programming and/or erase voltages for nonvolatile devices.

A LV voltage region 402-3 may be a region in which one or more low voltage devices are formed. As noted above, low voltage devices may operate within the normal power supply voltage of a device.

In the particular example of FIG. 4A, nonvolatile devices formed in a nonvolatile region 402-1 may include silicon-oxide-nitride-oxide-silicon (SONOS) type cells. SONOS type cells can have the general configuration of an insulated gate field effect transistor, but allow for a charge to be stored in one or more layers that are formed from an essentially insulating material. Such a charge can produce programmable threshold voltages.

As but one example, a SONOS-type cell may include a dielectric between a control gate and a substrate that includes a silicon nitride containing film sandwiched by silicon dioxide films.

In the particular example of FIG. 4A a SONOS-type dielectric 404 has been at least partially formed in a nonvolatile region 402-1. A SONOS-type dielectric 404 may be covered by an etch mask 406. An etch mask may be formed from photoresist or the like. In high and low voltage regions 402-2 and 402-3, a SONOS-type dielectric has been etched away, exposing a substrate.

Figure 4B:
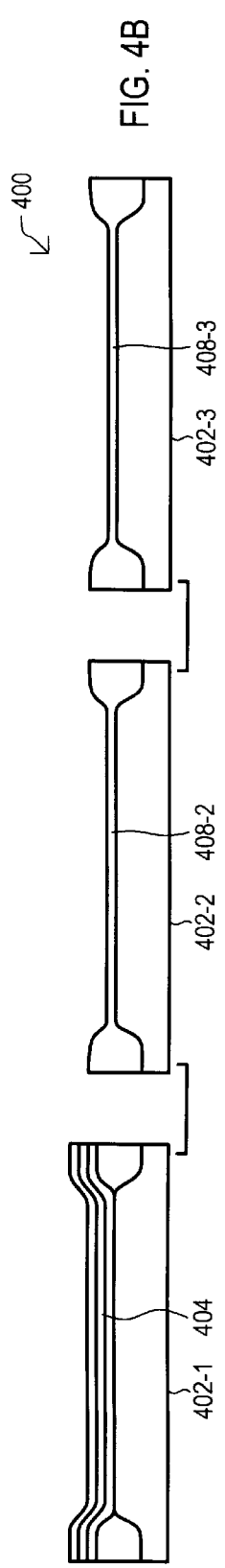

Referring again to FIG. 3, a method may include forming a gate insulator in high and low voltage regions (step 306). Referring to FIG. 4B, a step 306 may form a gate insulator 408-2 in HV voltage region 402-2 and a gate insulator 408-3 in a LV voltage region 402-3. In one very particular arrangement, an etch mask 406 over a nonvolatile region 402-1 may be removed prior to a step 306. Further, forming one or both gate insulators (408-2 and 408-3) can add to or complete the formation of a SONOS-type dielectric 404.

In one approach, gate insulators (408-2 and 408-3) may be formed by oxidizing a substrate. Such a step may simultaneously oxidize a top layer of a SONOS-type dielectric 404. In a preferred embodiment, a HV gate insulator 408-2 may be essentially the same as a gate insulator 408-3. This can allow for reduced process complexity. However, alternate approaches may include additional steps that result in HV gate insulators 408-2 that are different than LV gate insulators 408-3.

Gate insulators (408-2 and 408-3) may preferably be formed by oxidizing an exposed silicon substrate. Such an oxidation step may include a steam ambient. An oxidizing temperature may be in the general range of 650° C. to 1000° C., preferably about 800° C. to 900° C., more preferably about 850° C. A gate insulator (408-2 and 408-3) may be grown to a thickness in the general range of 80–200 Å, preferably 90–150 Å, even more preferably about 110 Å.

A method 300 may further include forming a conductive gate layer (step 308) and forming a high energy masking top insulating layer (step 310). Forming a conductive layer may include depositing a layer of polycrystalline and/or amorphous silicon (collectively referred to here as polysilicon) to a thickness of about 1,000–3,000 Å, more preferably about 1,500–2,5000 Å, even more preferably about 2,000 Å.

Forming a top insulating layer may include depositing a layer of silicon dioxide over a conductive gate layer. Such a top insulating layer may be formed with tetraethylorthosilicate (TEOS) to a thickness of about 1,500–3,500 Å, more preferably about 2,000–3,000 Å, even more preferably about 2,400 Å.

Figure 4C:
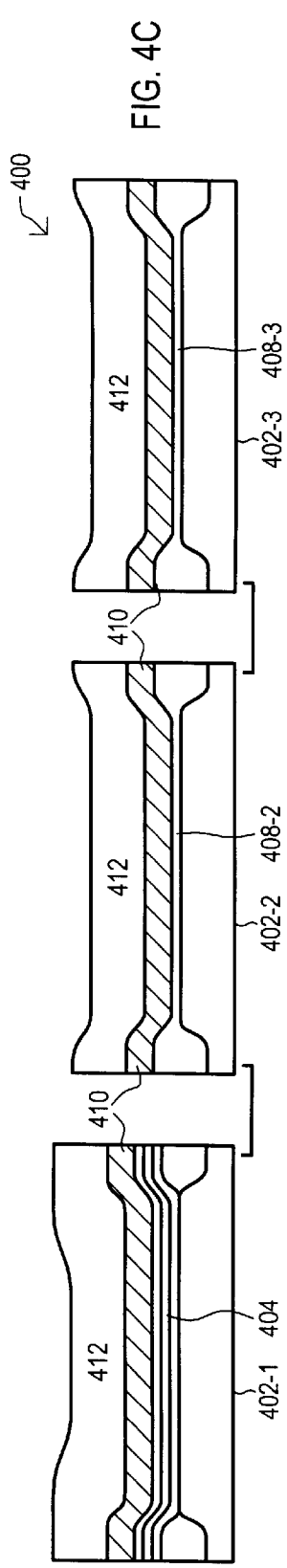

A semiconductor device following steps 308 and 310 is shown in FIG. 4C. A conductive gate layer 410 may be formed over nonvolatile, HV and LV regions (402-1/2/3). Such an approach may reduce the complexity of a manufacturing process as gates for all three types of devices (nonvolatile, HV and LV) may be formed at the same time. FIG. 4C also shows a top insulating layer 412 formed over a conductive gate layer 410.

A top insulating layer 412 may be considered a high energy implant masking layer in that the thickness of the top insulating layer 412 (in conjunction with or not in conjunction with underlying layers) can prevent subsequently implanted high energy ions from penetrating into channel regions of high voltage transistors.

It is noted that the thickness of a top insulating layer 412 may be unique when considered in conjunction with a resulting gate length of a high voltage transistor. Larger geometry transistors (such as those having gate lengths of 1 micron ($\mu$m) or larger) may have a top insulator over a conductive gate that may be considered relatively thick when compared with more recent gate lengths (less than 0.5 $\mu$m, more particularly less than 0.25 $\mu$m). However, such older, larger transistors may not include source and drain regions that are formed with both a LV ion implant step and a HV ion implant step.

A method 300 can further include forming a gate etch mask (step 312). A step 312 may include forming an etch mask of photoresist, or the like, over a HV region 402-2 of a semiconductor device. Following the formation of a gate etch mask, gate "stacks" may be etched (step 314).

In one particular arrangement, a step 314 may include forming gate stacks in a nonvolatile region 402-1, HV region 402-2 and LV region 402-3, in the same etch step. Such a simultaneous gate stack formation step may reduce process complexity and/or increase process throughput.

Figure 4D:
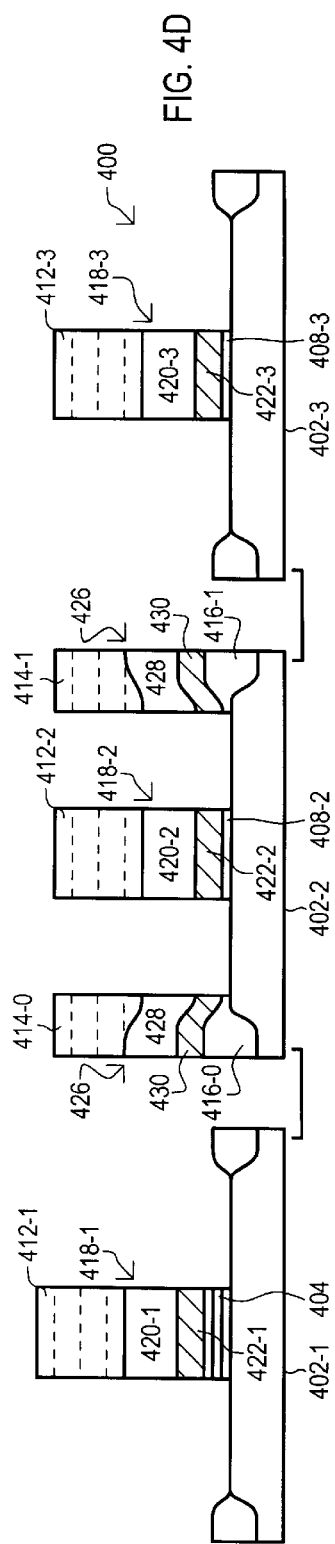

A semiconductor device 400 following a step 314 is shown in FIG. 4D. Gate etch masks 412-1, 412-2 and 412-3 can correspond to nonvolatile, HV and LV regions 402-1, 402-2 and 403-3, respectively. As shown in FIG. 4D, in addition to gate etch mask, a step 312 may also form isolation interface etch masks 414-0 and 414-1. Isolation interface etch masks (414-0 and 414-1) may be formed over regions of a substrate where an isolation structure (416-0 and 416-1) ends and an "active" region of a substrate begins.

Etching with gate etch masks (412-1, 412-2 and 412-3) and an isolation interface etch mask (414-0 and 414-1) in place can form nonvolatile gate stack 418-1, HV gate stack 418-2 and LV gate stack 418-3. Each gate stack (418-1, 418-2 and 418-3) can include a top insulator (420-1, 420-2, 420-3) and conductive gate (422-1, 422-2, 422-3). HV and LV gate stacks 418-2 and 418-3 may include gate insulators 408-2 and 408-3, respectively, while nonvolatile gate stack 418-1 may include a SONOS-type gate insulator 404.

It is noted that a thickness of top insulators 420-1, 420-2 and 420-3 may be greater than conventional transistor forming methods. A large top insulator thickness can translate to greater gate stack thickness. Conventionally, methods may seek to reduce gate stack thickness for a more effective gate stack etch and/or self-aligned contact etch.

As also shown in FIG. 4D, etching with an isolation interface etch mask 414 can form an isolation interface high energy implant mask 426. In the example shown, a high energy implant mask 426 can be formed at the same time as, and have the same general structure as, HV gate stack 418-2. Thus, a high energy implant mask 426 can include a top insulator 428 and conductive gate 430. In one particular arrangement, an isolation interface etch mask 414 and resulting high energy implant mask 426 may surround an active area in a substrate. Such an etch mask 414 may, or may not, form a common structure with a HV gate stack 418-2.

A gate mask etch may be a substantially anisotropic etch, such as a reactive ion etch.

It is noted that method 300 may include an ion implantation and/or other impurity introducing step following the formation of gate stacks (418-1, 418-2 and 418-3). Such a step may form lightly doped drain (LDD) type regions, into one or more regions (402-1, 402-2 or 403-3). It is noted that such a step may not include a high energy implant step.

For the purposes of this description it will be assumed that the particular high and low voltage regions (402-2 and 402-3) illustrate the formation of p-type devices, while a nonvolatile region 402-1 illustrates the formation of n-type devices. However, it is understood that a semiconductor device could also include n-type high voltage devices and/or n-type low voltage devices, as well as p-type nonvolatile devices.

Assuming the above mentioned conductivity types, a nonvolatile region 402-1 may be masked while a LDD type implant is performed in high and low voltage regions (402-2 and 402-3). Such an LDD implant may be at a dose in the range of $10^{10}$ to $10^{15}$ ions/cm$^2$, preferably $10^{12}$ to $10^{14}$ ions/cm$^2$, even more preferably about $1.0\times10^{13}$. Implant energies may be in the range of 10–50 keV, preferably about 20–40 keV, even more preferably about 30 keV. An ion source may include boron difluoride (BF$_2$).

A method 300 may continue with the formation of insulating sidewalls on gate stacks (step 316). Such a step may include depositing an insulating sidewall layer over gate stacks. Such a layer may then be anisotropically etched to form insulating sidewalls.

Forming a sidewall insulating layer may include depositing a layer of silicon dioxide over gate stack structures. Such a sidewall insulating layer may be formed with tetraethylorthosilicate (TEOS) to a thickness of about 800–2,000 Å, more preferably about 900–1,500 Å, even more preferably about 1,100 Å. Such a sidewall layer may then be etched back with an anisotropic etch, such as RIE, to form insulating sidewalls.

Figure 4E:
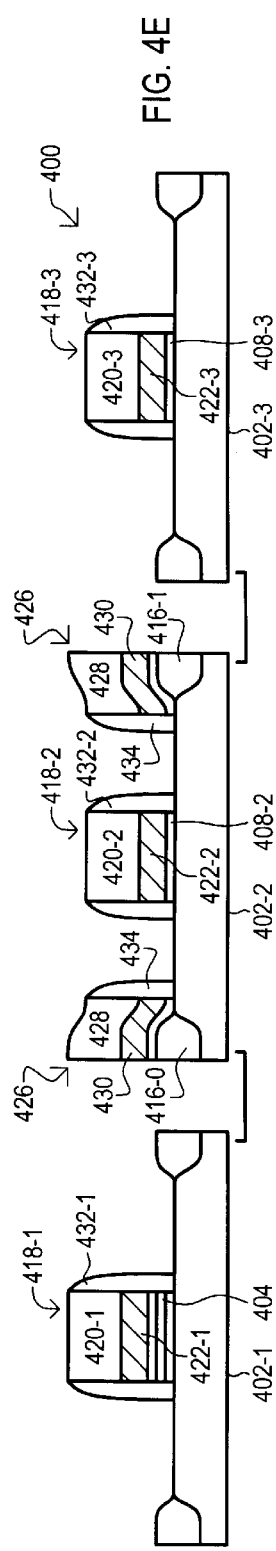

An example of a semiconductor device following a step 316 is shown in FIG. 4E. Insulating sidewalls 432-1, 432-2 and 432-3 can be formed on gate stacks 418-1, 418-2 and 418-3, respectively. It is noted that a vertical thickness of insulating sidewalls (432-1, 432-2 and 432-3) can be related to a thickness of top insulators (420-1, 420-2 and 420-3). In particular, because a top insulator may be thicker, an insulating sidewall (432-1, 432-2 and 432-3) may be correspondingly thicker when viewed vertically. Such an increase in sidewall thickness can allow insulating sidewalls 432-2 to prevent subsequently implanted high energy ions from penetrating into channel regions of high voltage transistors.

In this way, according to one embodiment both insulating sidewalls 432-2 and a corresponding HV gate stack 418-2 can prevent high energy ions from being implanted into a channel region.

It is noted that in the example of FIG. 4E, mask sidewalls 434 may also be formed on sides of a high energy implant mask 426.

A method 300 can further include a low energy ion implantation (step 318). A step 318 can form impurity regions in one or more portions of a semiconductor substrate. A semiconductor device following a step 318 is shown in FIG. 4F.

Figure 4F:
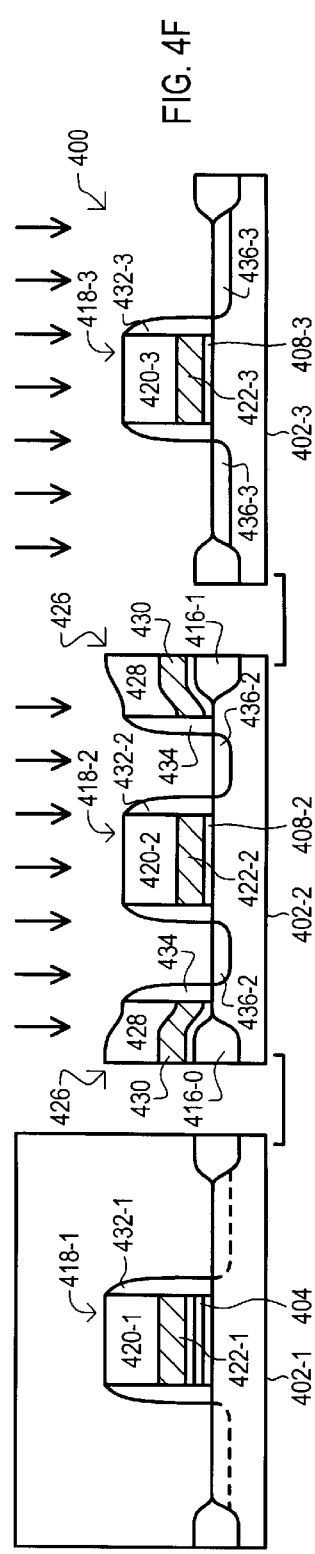

FIG. 4F shows impurity regions 436-2 and 436-3 formed in HV and LV regions 4022 and 402-3, respectively. Nonvolatile region 402-1 can be masked to prevent p-type ions from being implanted into n-type nonvolatile device regions. Low energy ions are represented by vertical arrows. Of course, such an implantation step may include implanting ions at an essentially non-perpendicular angle to a substrate. Impurity region 436-3 may be all or a portion of source/drain regions for a p-type low voltage transistor.

In the particular example of FIG. 4F, impurity regions 436-3 may form source/drain regions 436-2 for a low voltage device, while at the same time forming a portion of source/drain regions of a high voltage device. A low energy implant may have the same dose, energy and ion species as described in conjunction with FIG. 2B.

Of course, various n-type implant steps may be performed while p-type HV and LV regions are masked. Such implant steps may form low voltage n-type transistors and/or high voltage n-type transistors, as well as n-type nonvolatile transistors.

A method 300 may continue by masking nonvolatile and LV regions of a substrate (step 320) in preparation for a high energy implant step. A step 320 may include depositing a layer of photoresist over a substrate and developing such a layer so that a nonvolatile portions and low voltage portions remain covered while a high voltage portion is exposed.

Following a step 320, a method 300 may continue with a high energy ion implantation with a top insulator exposed (step 322). A semiconductor device corresponding to a step 322 is shown in FIG. 4G.

In FIG. 4G, high energy ions are represented by vertical arrows. High energy implanted ions can form high energy impurity regions 438 in a HV region 402-2. High energy implanted ions can penetrate materials further than low energy implanted ions. Consequently, high energy impurity regions 438 may be deeper than impurity regions 436-2. Still further, impurity regions 436-2 in conjunction with high energy impurity regions 438 may form source/drain regions having more graded junction than source/drains formed with a single or fewer implant steps. Such a graded junction may provide a higher breakdown voltage than non-graded junctions.

A high energy implant step may have the same dose, energy and ion species as described in conjunction with FIG. 2C.

The thickness of a HV gate stack 418-2 and corresponding insulating sidewalls 432-2 can function as a mask for high energy ions, without having to form an additional layer over a gate stack, such as conventional approaches that form a high energy implant mask of photoresist. At the same time, FIG. 4G shows how high energy impurity regions 438 can be aligned with outside edges of insulating sidewalls 432-2. This is in contrast to conventional approaches that may have high energy implant regions that are aligned with the sides of a gate/gate stack and thus form an undesirably shorter transistor channel.

FIG. 4G also shows how high energy implant masks 426 and corresponding mask sidewalls 434 can prevent high energy ions from being implanted in the vicinity of an substrate-isolation structure interface. In particular, high energy implant masks 426 and corresponding mask sidewalls 434 may introduce a space between the edges of high energy impurity regions 438 and the termination of isolation structure (416-0 and 416-1). This may prevent leakage paths that might otherwise develop if high energy ions are implanted into such a space.

FIG. 4G further shows regional implant masks 440-0 and 440-1. Regional implant masks may prevent high energy implanted ions from penetrating into a nonvolatile region 402-1 and LV region 402-3.

It is understood that while the various embodiments may advantageously provide a high voltage p-channel IGFET, alternate embodiment may form high voltage n-channel IGFETs.

One skilled in the art would recognize that while particular species and energies have been described for various ion implantation steps, these particular values should not be construed as necessarily limiting the invention thereto. Ion implantation steps may be viewed in terms of a resulting projected range. Thus, while a particular example of a boron species BF$_2^{49}$ is described as being implanted at a particular energy (e.g., 50 keV). Implanting an alternate boron species, such as B$^{11}$ at a lower energy can produce an equivalent projected range. Consequently, both implants can be considered to have a projected range equivalent to the species BF$_2^{49}$ at 50 keV.

Accordingly, it is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A method of forming a high voltage transistor, comprising the steps of:

implanting first ions at a first projected range into a first and second portion of a substrate; and forming high voltage source/drain regions by implanting second ions into the second portion of the substrate at a second projected range that is greater than the first projected range, the second portion of the substrate including a second region gate structure having a second region conductive gate, insulating sidewalls, and an exposed top gate insulating layer.

2. The method of claim 1, wherein:

the first and second ions comprise boron species.

3. The method of claim 1, wherein:

the second projected range is equivalent to the species $B^{11}$ implanted at an energy greater than about 35 kiloelectron volts (keV) and the first projected range is equivalent to a species $BF_2^{49}$ implanted at an energy less than about 65 keV.

4. The method of claim 1, wherein:

the second projected range is equivalent to the species $B_{11}$ implanted at an energy greater than about 45 kiloelectron volts (keV) and the first projected range is equivalent to the species $BF_2^{49}$ implanted at an energy less than about 57 keV.

5. The method of claim 1, wherein:

the first region includes a first region gate structure with a first region conductive gate, insulating sidewalls, and an exposed top gate insulating layer, and the first region of the substrate is masked from the second ions.

6. The method of claim 1, wherein:

the substrate includes a third region having a nonvolatile gate structure which includes a third region conductive gate formed over a charge storing structure, insulating sidewalls, and a top gate insulating layer, the third region being masked from the first and second ions.

7. The method of claim 6, wherein:

the charge storing structure includes a middle layer comprising silicon nitride sandwiched by top and bottom layers comprising silicon dioxide.

8. The method of claim 1, wherein:

the second region gate structures include transistor portions formed over an active region of a substrate and mask portions formed over an area where an active region is adjacent to a substrate isolation structure.

9. The method of claim 1, wherein:

the second region conductive gate has a gate length less than 0.5 microns and a top gate insulating layer thickness of greater than 1,500 angstroms.

10. A method of forming a graded junction transistor, comprising the steps of:

forming source/drain regions by implanting first ions to a first projected range and second ions to a second projected range that is greater than the first projected range, the first ions being implanted into a substrate masked with a gate structure that includes a conductive gate, insulating sidewalls, and an exposed top insulating layer, the gate structure thickness masking a channel region below the gate structure from the second ions.

11. The method of claim 10, wherein:

the top insulating layer has a thickness greater than 1,500 angstroms and a conductive gate length of less than 0.5 microns.

12. The method of claim 10, wherein:

the top insulating layer has a thickness greater than 2,200 angstroms and a conductive gate length of less than 0.25 microns.

13. The method of claim 12, wherein:

the second projected range is greater than the boron species $B_{11}$ implanted at about 45 kiloelectron volts (keV) and the top insulating layer has a thickness greater than 2,200 angstroms.

14. The method of claim 13, wherein:

the top insulating layer comprises silicon dioxide.

15. The method of claim 12, wherein:

the second projected range is greater than the boron species $B_{11}$ implanted at about 30 kiloelectron volts (keV) and the top insulating layer has a thickness greater than 1,500 angstroms.

16. A method of fabricating a semiconductor device, comprising the steps of:

masking a first region of a substrate that includes nonvolatile transistors;

implanting first ions at a first projected range into second and third regions of the substrate; and implanting second ions at a second projected range that is greater than the first projected range into the second region of the substrate, the second region of the substrate including a high voltage gate structure comprising insulating sidewalls formed on a top insulating layer formed over a conductive transistor gate formed over a gate insulator.

17. The method of claim 16, wherein:

the thickness of the top insulating layer is greater than 2,000 angstroms and the conductive gate length is less than 0.5 microns.

18. The method of claim 16, wherein:

the first region includes a nonvolatile gate stack comprising insulating sidewalls formed on a top insulating layer formed over a conductive gate formed over a charge storing layer comprising silicon nitride.

19. The method of claim 16, further including:

masking isolation active region interfaces in the second region from the second ions with mask structures comprising insulating sidewalls formed on the top insulating layer formed over an isolation gate formed over the gate insulator.

20. The method of claim 16, wherein:

the third region includes a low voltage gate structure comprising insulating sidewalls formed on the top insulating layer formed over a low voltage transistor gate formed over the gate insulator.

* * * * *